(12) United States Patent
Lin et al.

(10) Patent No.: US 11,249,232 B2
(45) Date of Patent: Feb. 15, 2022

(54) ELECTRONIC DEVICE

(71) Applicant: InnoLux Corporation, Miao-Li County (TW)

(72) Inventors: Hsiao-Lang Lin, Miao-Li County (TW); Tsung-Han Tsai, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 167 days.

(21) Appl. No.: 16/103,868

(22) Filed: Aug. 14, 2018

(65) Prior Publication Data

US 2020/0057184 A1 Feb. 20, 2020

(51) Int. Cl.
| | | |
|---|---|---|
| *G02B 5/30* | (2006.01) | |
| *G02F 1/1335* | (2006.01) | |
| *H01L 27/12* | (2006.01) | |
| *G02F 1/1362* | (2006.01) | |
| *H01L 51/52* | (2006.01) | |
| *H01L 25/16* | (2006.01) | |
| *G02F 1/1368* | (2006.01) | |

(52) U.S. Cl.
CPC ..... *G02B 5/3058* (2013.01); *G02F 1/133512* (2013.01); *G02F 1/133514* (2013.01); *G02F 1/133528* (2013.01); *G02F 1/136286* (2013.01); *H01L 27/124* (2013.01); *H01L 51/5281* (2013.01); *G02F 1/1368* (2013.01); *G02F 1/133548* (2021.01); *G02F 2201/121* (2013.01); *G02F 2201/123* (2013.01); *H01L 25/167* (2013.01)

(58) Field of Classification Search
CPC ........ B32B 2457/202; B32B 2457/206; H05K 2201/10136; H01L 27/1214; H01L 27/3244; H01L 27/124; H01L 23/52; H01L 23/522; H01L 23/528; H01L 27/0207; H01L 27/3276–3279; H01L 27/3297; G02F 1/134309; G02B 5/3016
See application file for complete search history.

(56) References Cited

U.S. PATENT DOCUMENTS

| | | | |
|---|---|---|---|
| 2010/0079704 A1 | 4/2010 | Cho | |
| 2016/0238882 A1* | 8/2016 | Yang | ................. G02F 1/133528 |
| 2017/0294565 A1* | 10/2017 | Kim | .................... H01L 25/0753 |
| 2017/0343855 A1 | 11/2017 | Han | |
| 2018/0074369 A1 | 3/2018 | Park | |

FOREIGN PATENT DOCUMENTS

| | | |
|---|---|---|
| CN | 105866875 A | 8/2016 |
| CN | 106125185 A | 11/2016 |
| CN | 106226856 A | 12/2016 |
| CN | 106249337 A | 12/2016 |
| WO | 2016/127610 A1 | 8/2016 |

* cited by examiner

*Primary Examiner* — Moazzam Hossain
*Assistant Examiner* — Stanetta D Isaac
(74) *Attorney, Agent, or Firm* — Winston Hsu

(57) ABSTRACT

An electronic device includes a substrate, a grid structure, and a plurality of polarizing wires. The grid structure is disposed on the substrate and includes a plurality of apertures. The polarizing wires are disposed on the substrate and extend across the apertures. A first number of a portion of the polarizing wires within a first aperture of the apertures is in a range from 50 to 15000.

18 Claims, 9 Drawing Sheets

ELECTRONIC DEVICE

BACKGROUND OF THE DISCLOSURE

1. Field of the Disclosure

The present disclosure relates to an electronic device, and more particularly, to an electronic device including a plurality of polarizing wires.

2. Description of the Prior Art

In electronic devices, polarizing films or wire grid polarizers (WGP) are important polarizing components. In addition, wire grid polarizers could be used as the polarizing components in the curved, foldable or stretchable substrate of electronic devices. As the requirements of the electronic device from users are increased, how to improve optical efficiency is one of the important tasks in the electronic industry.

SUMMARY OF THE DISCLOSURE

The present disclosure provides an electronic device that includes a substrate, a grid structure and a plurality of polarizing wires. The grid structure is disposed on the substrate and includes a plurality of apertures. The polarizing wires are disposed on the substrate and extend across the apertures. A first number of a portion of the polarizing wires within a first aperture of the apertures is in a range from 50 to 15000.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. For purposes of illustrative clarity and being easily understood, various drawings of this disclosure show a portion of the electronic device, and certain elements in various drawings may not be drawn to scale. In addition, the number or dimension of elements shown in drawings are illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ."

It will be understood that when an element or layer is referred to as being "on" or "connected to" another element or layer, it may be directly on or directly connected to the other element or layer, or intervening elements or layers may be presented (indirectly). In contrast, when an element is referred to as being "directly on" or "directly connected to" another element or layer, there are no intervening elements or layers presented.

Although terms such as first, second, third, etc., may be used to describe diverse constituent elements, such constituent elements are not limited by the terms. The terms are used to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following may be replaced, recombined or mixed with one another to constitute another embodiment without departing from the spirit of the present disclosure.

Figure 1:
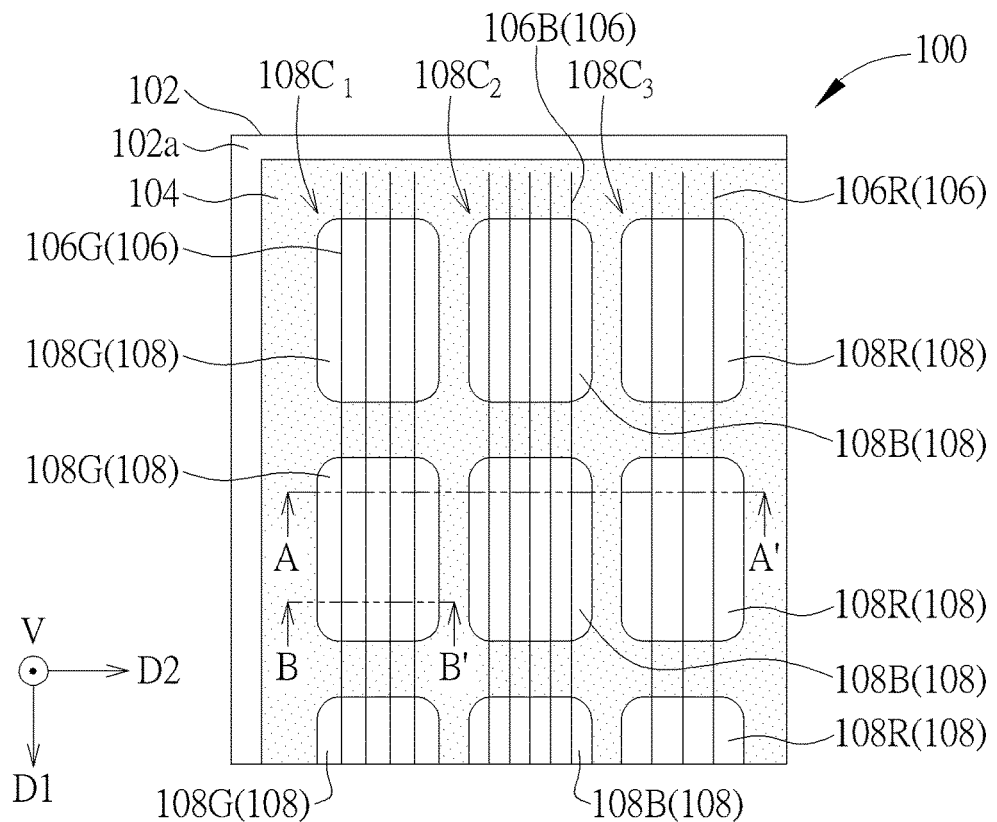
FIG. 1 schematically illustrates a top view of a portion of a substrate of an electronic device according to an embodiment of the present disclosure.
Figure 2:
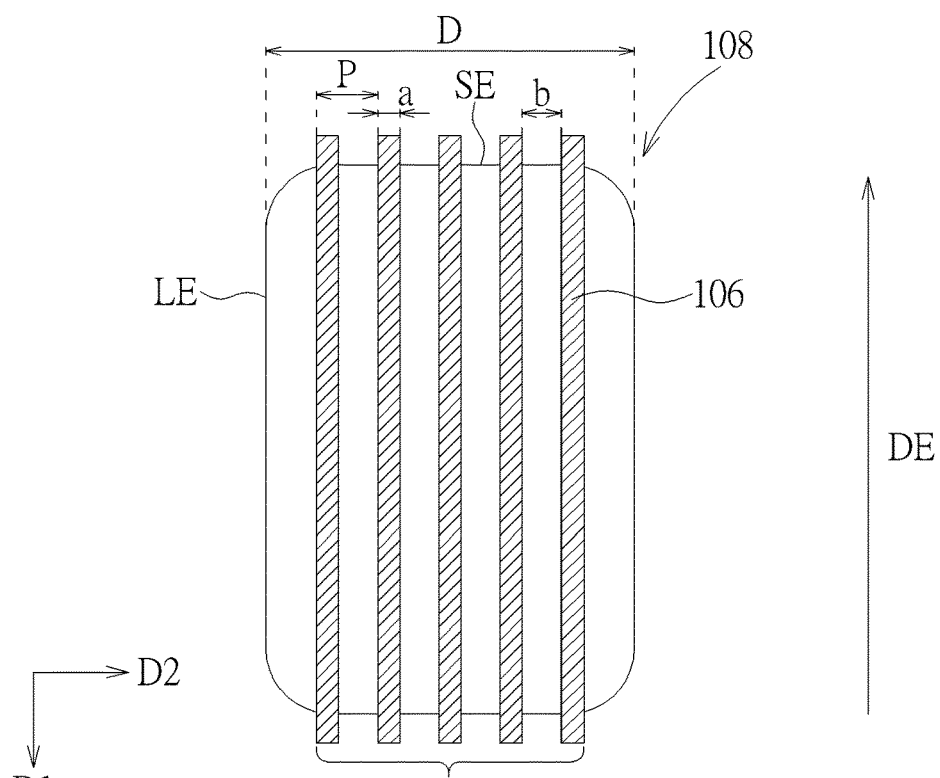
FIG. 2 schematically illustrates a top view of an aperture and a plurality of polarizing wires according to the embodiment of the present disclosure.
Figure 3:
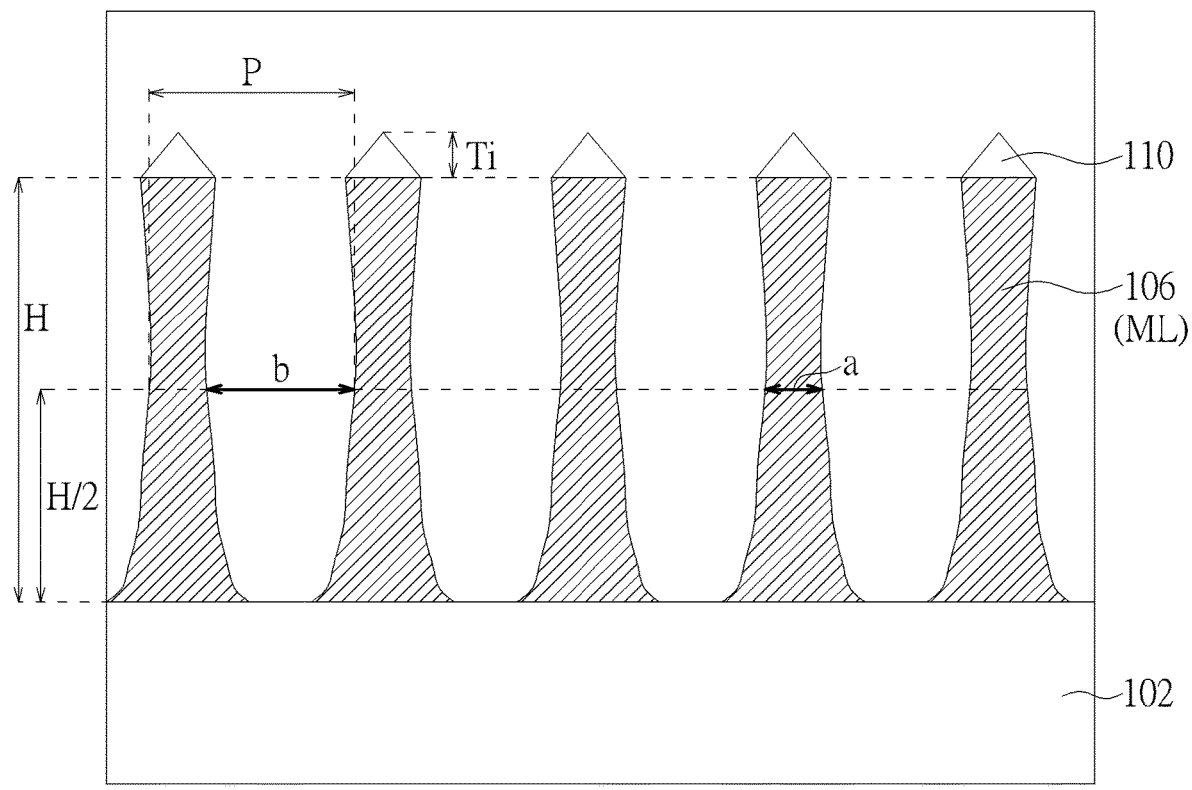
FIG. 3 schematically illustrates a cross-sectional view of a plurality of polarizing wires formed by an etching process according to the embodiment of the present disclosure.
Figure 4:
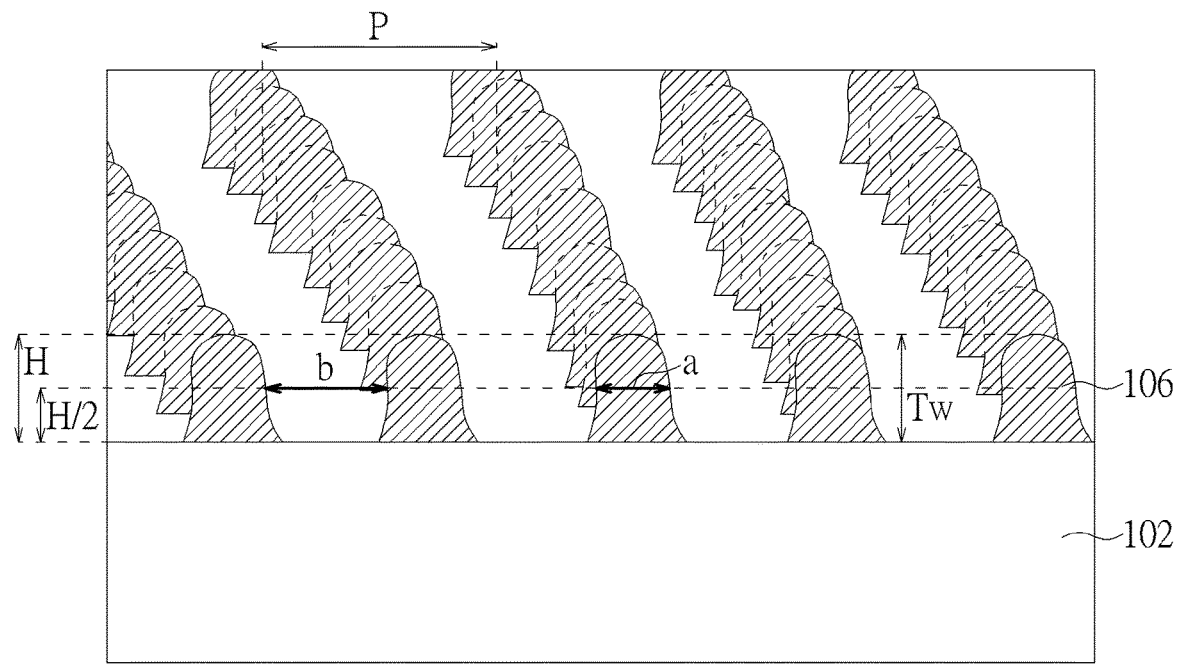
FIG. 4 schematically illustrates a cross-sectional view of a plurality of polarizing wires formed by an imprint process according to the embodiment of the present disclosure.

Referring to FIG. 1 to FIG. 4, FIG. 1 schematically illustrates a top view of a portion of a substrate of an electronic device according to an embodiment of the present disclosure, FIG. 2 schematically illustrates a top view of an aperture and a plurality of polarizing wires according to the embodiment of the present disclosure, FIG. 3 schematically illustrates a cross-sectional view of a plurality of polarizing wires formed by an etching process according to the embodiment of the present disclosure, and FIG. 4 schematically illustrates a cross-sectional view of a plurality of polarizing wires formed by an imprint process according to the embodiment of the present disclosure. The number of the polarizing wires corresponding to each aperture shown in the drawings is illustrative and is not limited thereto. For example, the number of the polarizing wires corresponding to each aperture may be greater than the number shown in the figures. The electronic device includes display device, photography device, sensing device, lighting device or an antenna (such as a liquid crystal antenna), but it is not limited thereto.

As shown in FIG. 1, the electronic device 100 includes a substrate 102, a grid structure 104 and a plurality of polarizing wires 106. The grid structure 104 is disposed on a surface 102a of the substrate 102. The grid structure 104 includes a plurality of apertures 108. The grid structure 104 can include the opaque materials, the apertures 108 can allow the light penetrating through. The apertures 108 may be arranged in an array and form a plurality of aperture columns (e.g. aperture columns $108C_1$, $108C_2$ and $108C_3$). The electronic device 100 includes a plurality of data lines extending along a first direction D1. The aperture columns $108C_1$, $108C_2$ and $108C_3$ may extend along the first direction D1. The aperture column $108C_2$ includes a plurality of first apertures 108B, the aperture column $108C_1$ includes a plurality of second apertures 108G, and the aperture column $108C_3$ includes a plurality of third apertures 108R. In one embodiment, one of the first apertures 108B corresponds to one of first electronic units, one of the second apertures 108G corresponds to one of second electronic units, and one of the third apertures 108R corresponds to one of third electronic units. The electronic device includes liquid crystal, organic light emitting diode (OLED), light emitting diodes (LED), mini-LED, micro-LED, quantum dots (QDs), quantum dots LEDs (QLEDs or QD-LEDs), fluorescent materials, phosphorescent materials, other materials or combination thereof, but it is not limited thereto.

In some embodiments, the electronic units may be defined by the grid structure. For example, one of the apertures of the grid structure is corresponding to one of the electronic units, and a region of the electronic unit is not overlapping with the grid structure in a normal direction V of the substrate 102. In some embodiments, when the electronic device 100 is a liquid crystal (LC) device, the electronic unit may include components such as a portion of the backlight (includes LED), a light converting layer (e.g. QD), LC or other components within a region of the corresponding aperture in the normal direction V of the substrate 102. In some embodiments, when the electronic device 100 is a LED (including mini-LED or micro-LED) device or an OLED device, the electronic unit may include components such as LED (including mini-LED or micro-LED), a light converting layer (e.g. QD) or other components within a region of the corresponding aperture in the normal direction V of the substrate 102. In some embodiments, when the electronic device 100 is a display device, the electronic unit may be a sub-pixel. Additionally, the first electronic units may be blue electronic units and emit a first light with a first wavelength. The second electronic units may be green electronic units and emit a second light with a second wavelength. The third electronic units may be red electronic units and emit a third light with a third wavelength. Specifically, the first wavelength may be defined as a crest of a main-waveband of the first light. The first wavelength could be within a range from 380 nanometers (nm) to 490 nm, such as 439 nm or 477 nm. The second wavelength may be defined as a crest of a main-waveband of the second light. The second wavelength could be within a range from 490 nm to 575 nm, such as 527 nm or 542 nm. The third wavelength may be defined as a crest of a main-waveband of the third light. The third wavelength could be within a range from 580 nm to 780 nm, such as 626 nm or 640 nm, but it is not limited thereto. Accordingly, the first wavelength is less than the second wavelength, and the second wavelength is less than the third wavelength. The first light, the second light, and the third light can be defined as final output lights of the electronic device 100 perceived by users.

The polarizing wires 106 may include opaque materials. In one embodiment, the material of the polarizing wires 106 includes metal, metal alloy, other suitable materials, or combination thereof, but it is not limited thereto. When the polarizing wires 106 includes metal, which can be the so-called wire grid polarizer (WGP). The polarizing wires 106 may be used for polarizing light penetrating through gaps between the adjacent polarizing wires 106. The polarizing wires 106 are disposed on the substrate 102. For example, the polarizing wires 106 may be disposed at any position (or layer) of the electronic device 100 according to different designs. In one embodiment, an extending direction of one of the aperture columns (such as aperture column $108C_1$, $108C_2$ and $108C_3$) may be substantially parallel to an extending direction of the polarizing wires 106. The polarizing wires 106 may extend in the first direction D1 and extend across the corresponding apertures 108 as shown in FIG. 1. A portion of the polarizing wires 106 (e.g. the first polarizing wires 106B, the second polarizing wires 106G or the third polarizing wires 106R) could extend across one of the aperture columns (e.g. aperture column $108C_1$, $108C_2$ or $108C_3$) in the normal direction V of the substrate 102. Specifically, the first polarizing wires 106B could extend across at least one of the first apertures 108B in the aperture column $108C_2$, the second polarizing wires 106G could extend across at least one of the second apertures 108G in the aperture column $108C_1$, and the third polarizing wires 106R could extend across at least one of the third apertures 108R in the aperture column $108C_3$. The first polarizing wires 106B, the second polarizing wires 106G, and the third polarizing wires 106R may be continuous, but it is not limited thereto. The description of "continuous" means that one polarizing wire 106 may extend across at least two adjacent ones of the apertures 108 in one of the aperture columns. In one embodiment, at least one polarizing wires 106 may extend across all the apertures 108 in one of the aperture columns (such as aperture column $108C_1$, $108C_2$ or $108C_3$) as shown in FIG. 1. The polarizing wires may contact with the grid structure, or other components (or layers) could be disposed between the polarizing wires and the grid structure.

A first number of a portion of the plurality of polarizing wires (the first polarizing wires 106B) within a first aperture 108B of the plurality of apertures is in a range from 50 to 15000. A second number of the second polarizing wires 106G within one of the second apertures 108G is in a range from 50 to 15000. A third number of the third polarizing wires 106R within one of the third apertures 108R is in a range from 50 to 15000. In one embodiment, the first number, the second number, and the third number may be different, wherein the first number may be greater than the second number, and the second number may be greater than the third number. In other embodiments, the first number, the second number, and the third number may be the same, but it is not limited thereto. The polarizing wires (or a part of the polarizing wires) within one of the corresponding aperture means that the polarizing wires and the aperture are overlapped in the normal direction V of the substrate. To measure the number of polarizing wires within an aperture, one of the substrate of the panel comprising polarizing wires could be selected and analyzed by scanning electron microscope (SEM), but not limited to this. The number of polarizing wires within the aperture (not overlapped with the grid structure) in the normal direction V of the substrate would then be calculated.

An included angle between an extending direction of one of the apertures (such as an extending direction DE of the first aperture) and an extending direction of the polarizing wires 106 is in a range from 0 degrees to 90 degrees.

As shown in FIG. 2, the apertures 108 may include two long edges LE and two short edges SE, one of two short edges SE may connect between two long edges LE, and the extending direction of one of the apertures is the same as an extending direction of one of long edges LE, the included angle is about in a range from 0 degrees to 5 degrees, but the disclosure is not limited to this. In some embodiment, the included angle is in a range from 0 degrees to 30 degrees. In some embodiments, the included angle is in a range from 30 degrees to 60 degrees (such as 45 degrees). In some embodiments, the included angle is in a range from 60 degrees to 90 degrees. As shown in FIG. 2, one of the polarizing wires 106 has a line width "a", two adjacent ones of the polarizing wires 106 has a gap "b", and the polarizing wires 106 have a pitch "P". Specifically, the line width "a" is the maximum width of one of the polarizing wires 106, the gap "b" is the maximum gap between two adjacent ones of the polarizing wires 106, and the pitch "P" is the sum of one of the line width "a" and the adjacent gap "b". That is, pitch (P)=line width (a)+gap (b). For example, within one of the first aperture 108B, a ratio "c" of a line width "a" to a gap "b" is in a range from 0.3 to 3. Additionally, the ratio "c" of the second polarizing wires 106G within one of the second apertures 108G is in a range from 0.3 to 3. The ratio "c" of the third polarizing wires 106R within one of the third apertures 108R is in a range from 0.3 to 3. The ratio can be expressed by c=a/b. In this embodiment, the gap "b" is one quarter of the wavelength "w" of the light passing through the polarizing wires 106 and the corresponding aperture 108, that is, b=0.25w. Next, the pitch "P" can be expressed by P=b*c+b or P=b*(1+c). Further, the pitch "P" can be expressed by P=(1+c)*0.25w since b=0.25w.

Next, the number (N1) of pitch within one of the apertures can be calculated by N1=D/(1+c)*0.25w. The number (N1) of pitch within one of the apertures is approximately equivalent to the number (N) of the polarizing wires 106 within one of the apertures 108, such as the first number of the first polarizing wires 106B. "D" may be the maximum length of the aperture 108 in a direction, the above direction may be perpendicular to the extending direction of the polarizing wires 106, but it is not limited thereto. The D values of the length of different apertures 108 may be the same or different. For example, the D values of the length of different apertures 108 may be the same in this embodiment. According to the above formula, the number of the polarizing wires 106 is inversely proportional to the wavelength of the light passing through the polarizing wires 106 and the corresponding aperture 108. Therefore, the first number of the first polarizing wires 106B corresponding to the blue electronic unit should be greater than the third number of the third polarizing wires 106R corresponding to the red electronic unit. The second number of the second polarizing wires 106G corresponding to the green electronic unit should be less than the first number and greater than the third number. In one embodiment, disposing different numbers of polarizing wires 106 corresponding to different colors of the electronic units (or the apertures 108) can enhance the polarizing effect.

In addition, two adjacent ones of the first polarizing wires 106B within one of the first apertures 108B have a first gap, two adjacent ones of the second polarizing wires 106G within one of the second apertures 108G have a second gap, two adjacent ones of the third polarizing wires 106R within one of the third apertures 108R have a third gap. Since the gap "b" between two adjacent ones of the polarizing wires 106 is proportional to the wavelength "w" of the light passing through the polarizing wires 106, the first gap is less than the second gap, and the second gap is less than the third gap.

Further, the ratio "c" is inversely proportional to the gap "b". The line width "a" of one of the first polarizing wires 106B, the line width "a" of one of the second polarizing wires 106G, and the line width "a" of one of the third polarizing wires 106R may be the same in this embodiment. A line width of one of the plurality of polarizing wires is in a range from 50 nanometers to 500 nanometers. Accordingly, a first ratio of the line width of one of the first polarizing wires 106B to the gap between two adjacent ones of the first polarizing wires 106B within one of the first apertures 108B is greater than a second ratio of the line width of one of the second polarizing wires 106G to the gap between two adjacent ones of the second polarizing wires 106G within one of the second apertures 108G. Further, the second ratio is greater than a third ratio of the line width of one of the third polarizing wires 106R to the gap between two adjacent ones of the third polarizing wires 106R within one of the third apertures 108R.

Referring to FIG. 1 and FIG. 2, since the manufacturing deviation or variation (such as an alignment deviation) may occur in the manufacturing processes, the number "N" of the polarizing wires 106 within the corresponding aperture 108 may be adjusted when the manufacturing deviation or variation is taken into consideration. For example, the number of the polarizing wires 106 within one of the corresponding apertures 108 may be in a range from "N−25" to "N+25", wherein N can be calculated by the aforementioned formula. Therefore, the polarizing effect can be maintained even when the manufacturing deviation or variation is occurred.

As shown in FIG. 3, the polarizing wires 106 can be formed by a photolithography process or an etching process. For example, the photolithography process or the etching process can be performed to a metal layer ML in order to form the polarizing wires 106. The metal layer ML is disposed on the substrate 102. Although FIG. 3 does not show other layers between the metal layer ML and the substrate 102, it should be realized that any other suitable layers may exist between the metal layer ML and the substrate 102. In some embodiments, the substrate 102 shown in FIG. 3 may represent the substrate or any other layer(s) disposed thereon. As an example, one of the line widths "a" of the polarizing wires 106 may be in a range from 70 nm to 90 nm (such as 79.6 nm), one of the gaps "b" between two adjacent ones of the polarizing wires 106 may be in a range from 200 nm to 230 nm (such as 216 nm). Therefore, the ratio "c" may be about 0.37, the pitch "P"

may be about 295 nm. One should realize the above-mentioned values are examples and are not intended to limit the present disclosure. The line width "a", the gap "b", and the pitch "P" may be calculated at the half of the height H of one of the polarizing wires 106 as shown in FIG. 3. An insulating layer 110 (such as a silicon oxide layer or a silicon nitride layer, but it is not limited thereto) can be disposed on the top of the polarizing wires 106, the thickness Ti of the insulating layer 110 may be in a range from 45 nm to 60 nm, but it is not limited thereto. The shape of the insulating layer 110 in FIG. 3 is only for example, but it is not limited thereto.

As shown in FIG. 4, the polarizing wires 106 can be formed by an imprint process in some embodiments. For example, the droplets of the material of the polarizing wires 106 can be disposed on the surface of the substrate 102 by a nozzle jet through spraying, and a mask mold having the predetermined shapes of the polarizing wires 106 can be impressed on the surface of the substrate 102 to press the droplets and form the polarizing wires 106. In some embodiments, the material of the polarizing wires 106 can be filled into the trenches of the mask mold having the predetermined shapes of the polarizing wires 106 first, the mask mold may be stamped on the substrate 102 by way of the openings of the trenches facing the surface of the substrate 102 after the material in the trenches are solidified. Therefore, the material transferred from the mask mold forms the polarizing wires 106. The line width "a" of one of the polarizing wires 106 may be in a range from 70 nm to 90 nm (such as 82 nm), one of the gaps "b" between two adjacent ones of the polarizing wires 106 may be in a range from 110 nm to 130 nm (such as 120 nm). Therefore, the ratio "c" may be about 0.68 and the pitch "P" may be about 202 nm. The line width "a", the gap "b", and the pitch "P" may be calculated at the half of the heights (H) of the polarizing wires 106. Additionally, the thickness Tw (or heights H) of the polarizing wires 106 may be in a range from 130 nm to 150 nm. One should realize the above-mentioned values are examples and are not intended to limit the present disclosure.

Although the polarizing wires 106 in FIG. 3 and FIG. 4 are disposed on the surface of the substrate 102, the present disclosure is not limited thereto. The polarizing wires 106 can be disposed on any suitable layer in the electronic device. Additionally, in some embodiments, one of the line widths "a" of the polarizing wires 106 may be in a range from 50 nm to 500 nm, one of the gaps "b" between two adjacent ones of the polarizing wires 106 may be in a range from 50 nm to 200 nm, one of the thicknesses of the polarizing wires 106 may be in a range from 50 nm to 800 nm, but it is not limited thereto.

Figure 5:
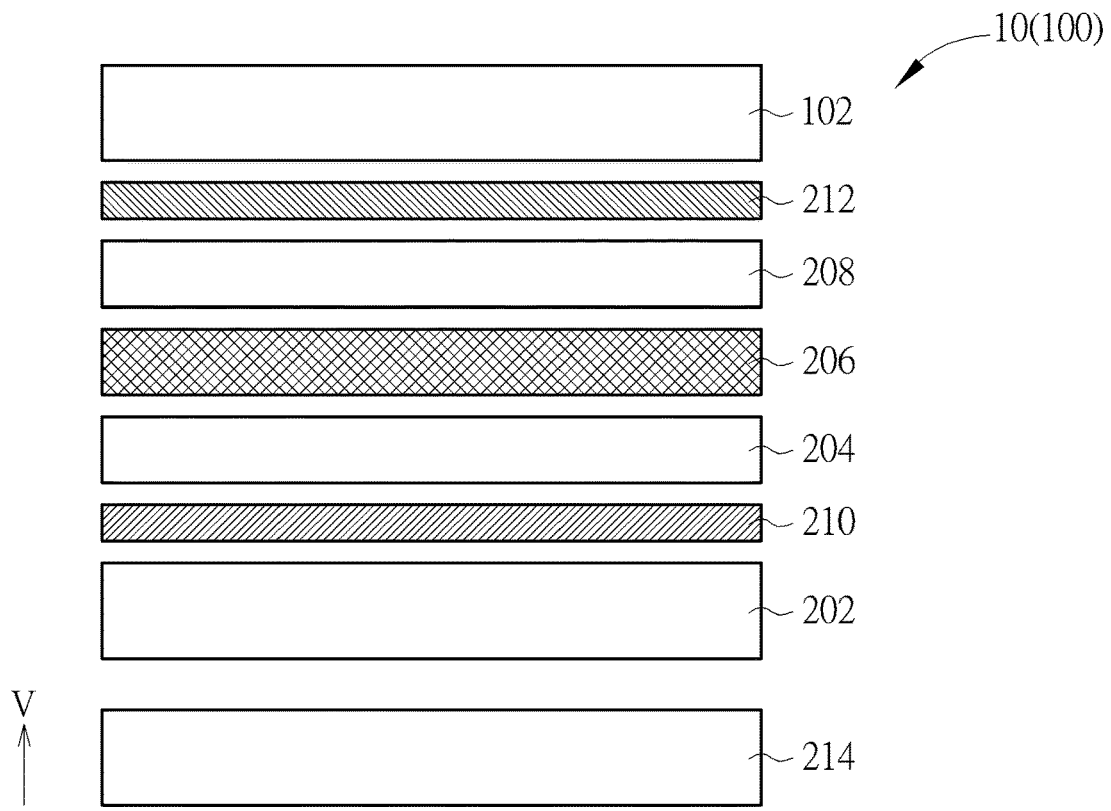
FIG. 5 schematically illustrates a cross-sectional view of an electronic device according to the embodiment of the present disclosure.
Figure 6:
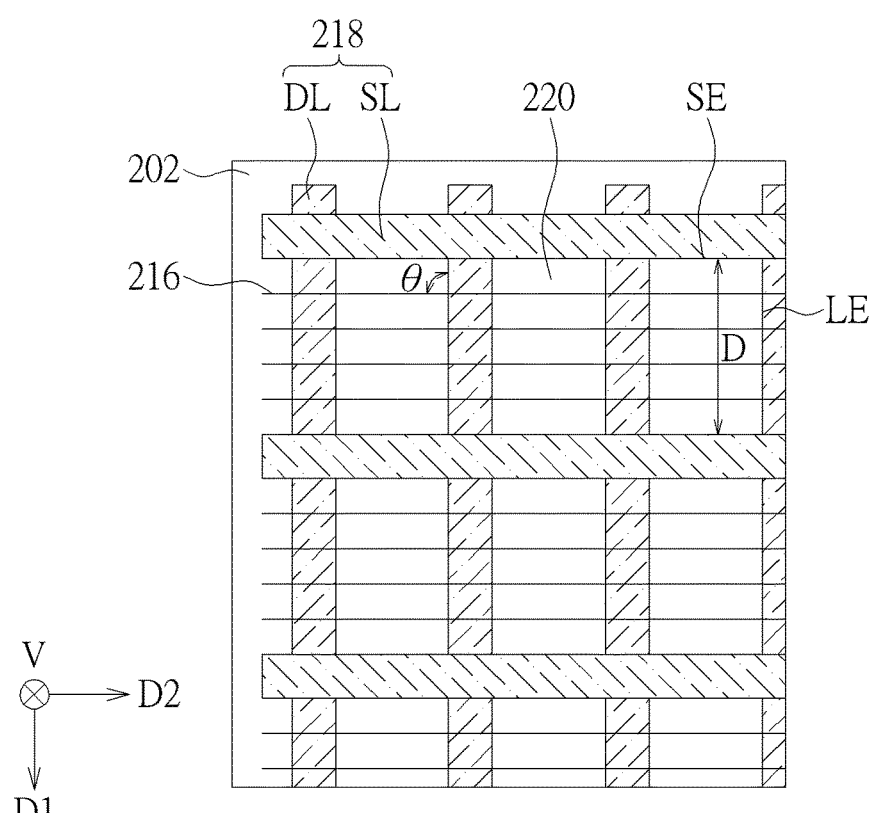
FIG. 6 schematically illustrates a top view of a portion of a substrate of the electronic device according to the embodiment of the present disclosure.

FIG. 5 schematically illustrates a cross-sectional view of an electronic device according to the embodiment of the present disclosure. FIG. 6 schematically illustrates a top view of a portion of a substrate of the electronic device according to the embodiment of the present disclosure. As shown in FIG. 5, when the electronic device 10 is a display device, the electronic device 10 (in FIG. 5) may include the substrate 202, the substrate 102, active matrix (AM) layer 204, display layer 206, light converting layer 208, first polarizer 210 or second polarizer 212, but the disclosure is not limited thereto. The substrate 202 and the substrate 102 may be disposed opposite to each other. The display layer 206 includes liquid crystal, Organic Light-Emitting diodes (OLED), Light-Emitting diodes (LED), micro LED, mini LED, QD, or combination thereof, but the disclosure is not limited thereto. In some embodiments, when the electronic device 10 is liquid crystal device, the electronic device 10 includes backlight module 214, the substrate 202 may disposed between the substrate 102 and the backlight module 214, the display layer 206 (liquid crystal layer) may be disposed between the substrate 102 and the substrate 202. The substrate 202 (or the substrate 102) may include transparent substrate (includes glass substrate or plastic substrate). The substrate 202 (or the substrate 102) may be a flexible or rigid circuit board, but it is not limited thereto. The material of the substrate 202 (or the substrate 102) may be glass, quartz, organic polymer, metal or the like. Organic polymer includes polyimide (PI), polyethylene terephthalate (PET), polycarbonate (PC), but the disclosure is not limited thereto.

In addition, the electronic device 10 comprises a plurality of scan lines and a plurality of data lines, the scan lines and the data lines are interlaced. In detail, the AM layer 204 (includes a plurality of scan lines, a plurality of data lines, a plurality of thin film transistors (TFTs) or other circuit components) is disposed between the substrate 202 and the display layer 206.

In addition, in some embodiments, the light converting layer 208 may be disposed between the display layer 206 and the substrate 102. In some embodiments, the light converting layer 208 may be disposed between the display layer 206 and the substrate 202. In some embodiments, the light converting layer 208 can be disposed between the first polarizer 210 and the backlight module 214. In some embodiments, the light converting layer 208 can be disposed between the first polarizer 210 and the AM layer 204. In some embodiments, the light converting layer 208 can be disposed between the display layer 206 and the black matrix (BM) layer. The light converting layer 208 includes color filters, quantum dot (QD), fluorescent material, phosphor material, pigment or dye material, but the disclosure is not limited thereto.

In some embodiments, the grid structure 104 may be disposed between the display layer 206 and the substrate 102. In some embodiments, the grid structure 104 may be disposed between the display layer 206 and the substrate 202. In some embodiments, the grid structure 104 may be disposed between the display layer 206 and the light converting layer 208. In some embodiments, the grid structure 104 may be disposed between the display layer 206 and the second polarizer 212 (or the first polarizer 210). In some embodiments, the grid structure 104 may be disposed between the AM layer 204 and the substrate 202.

In addition, the polarizing wires 106 may include the first polarizer 210 or the second polarizer 212. The first polarizer 210 or the second polarizer 212 may be a WGP or a conventional polarizing film. The conventional polarizing film includes polyvinyl alcohol (PVA) film. In this embodiment (FIG. 5), the second polarizer 212 (such as WGP) may be disposed between the display layer 206 and the substrate 102, or the second polarizer 212 may be disposed between the display layer 206 and the light converting layer 208. The second polarizer 212 may be electrically connected to the common electrode formed on the substrate 102 to have a fixed (or constant) electrical potential. In some embodiments, the second polarizer 212 may be disposed between the light converting layer 208 and the display layer 206. In some embodiments, the second polarizer 212 (such as conventional polarizing film) may be disposed on the substrate 102. In some embodiments, the first polarizer 210 (such as WGP) may be disposed between the display layer 206 and the substrate 202, or the first polarizer 210 may be disposed between the AM layer 204 and the substrate 202, the first polarizer 210 may be electrically connected to the common electrode formed on the substrate 202 to have a fixed (or constant) electrical potential. In some embodiments, the first polarizer 210 (such as conventional polarizing film) may be disposed between the substrate 202 and the backlight module 214.

As shown in FIG. 6, the grid structure 218 is defined by a plurality of scan lines SL and a plurality of data lines DL, thus the grid structure 218 may be included in the AM layer 204 in FIG. 5. The data lines DL may extend in the first direction D1, the scan lines SL may extend in the second direction D2. The first direction D1 is substantially perpendicular to the second direction D2. The scan lines SL cross the data lines DL to form a plurality of apertures 220. The scan lines SL (or the data lines DL) include opaque conductive materials (e.g. metal), but it is not limited thereto. The electronic device 10 may include a black matrix layer, which may have the pattern corresponding to the scan lines SL and the data lines DL to cover the scan lines SL and the data lines DL on tow view of the substrate, but it is not limited thereto. The first polarizer 210 (FIG. 6) may be the WGP, the first polarizer 210 include a plurality of polarizing wires 216. The extending direction of the polarizing wires 216 is along the second direction D2 (the extending direction of the scan lines SL), the polarizing direction of the first polarizer 210 is substantially perpendicular to the polarizing direction of the second polarizer 212, but it is not limited thereto. Further, an included angle θ between an extending direction of the long edge LE of one aperture 220 and the extending direction of the polarizing wires 216 within the corresponding aperture 220 is in a range from 80 degrees to 95 degrees. In one embodiment, the included angle θ is about 90 degrees.

In some embodiments, when the light provided by the backlight module 214 is white light, at least one of the apertures is not disposed with the light converting layer 208. The light penetrating the first polarizer 210 within the aperture is not converted by the light converting layer 208, and the number of the polarizing wires 216 within the aperture 220 is calculated by the formula N=D/(1+c)*0.25w with the wavelength of green light (e.g. 527 nm) to achieve the better polarizing effect. Here, the length "D" may be one of the lengths of the long edges of the aperture corresponding to the electronic unit, the number of the polarizing wires 216 within one of the apertures 220 may be in a range from N−25 to N+25.

In some embodiments, when the light provided by the backlight module 214 is blue light, at least one of the apertures is not disposed with the light converting layer 208. The light penetrating the first polarizer 210 within the aperture is not converted by the light converting layer 208, and the number of the polarizing wires 216 within the aperture 220 is calculated by the formula N=D/(1+c)*0.25w with the wavelength of blue light to achieve the better polarizing effect.

In some embodiments, when the light penetrating the polarizing wires within the corresponding apertures is converted by the light converting layer 208 (e.g. QDs, color filters, fluorescent material, phosphor material, but not limited to this), the number of these polarizing wires is determined by the wavelength of the penetrating light.

In some embodiments, the light converting layer 208 (such as color filters) may be disposed on the first polarizer 210 and the backlight module 214, the light provided by the backlight module 214 is white light, the light penetrating the first polarizer 210 may be white light. Accordingly, the number of the polarizing wires of the first polarizer 210 within one of the apertures is determined by the wavelength of green light.

In some embodiments, the light converting layer 208 may be disposed on the first polarizer 210 and the backlight module 214, the light provided by the backlight module 214 may be blue light, the light penetrating the first polarizer 210 may be blue light. Accordingly, the number of the polarizing wires of the first polarizer 210 within one of the apertures is determined by the wavelength of blue light.

In some embodiments, the first polarizer 210 and the second polarizer 212 can be disposed between the substrate 202 and the substrate 102, the second polarizer 212 can be disposed on the first polarizer 210, and the light converting layer 208 may be disposed between the first polarizer 210 and the second polarizer 212. Since the light provided by the backlight module 214 is blue light, and the light provided by penetrating the first polarizer 210 is blue light, the light penetrating the light converting layer 208 may have one of colors (includes red, green, blue), the light penetrating the second polarizer 212 may have one of colors (includes red, green, blue). The number of the polarizing wires of the second polarizer 212 within one of the apertures is determined by the wavelength of the color light, which penetrating the light converting layer 208 and the second polarizer 212.

Figure 7:
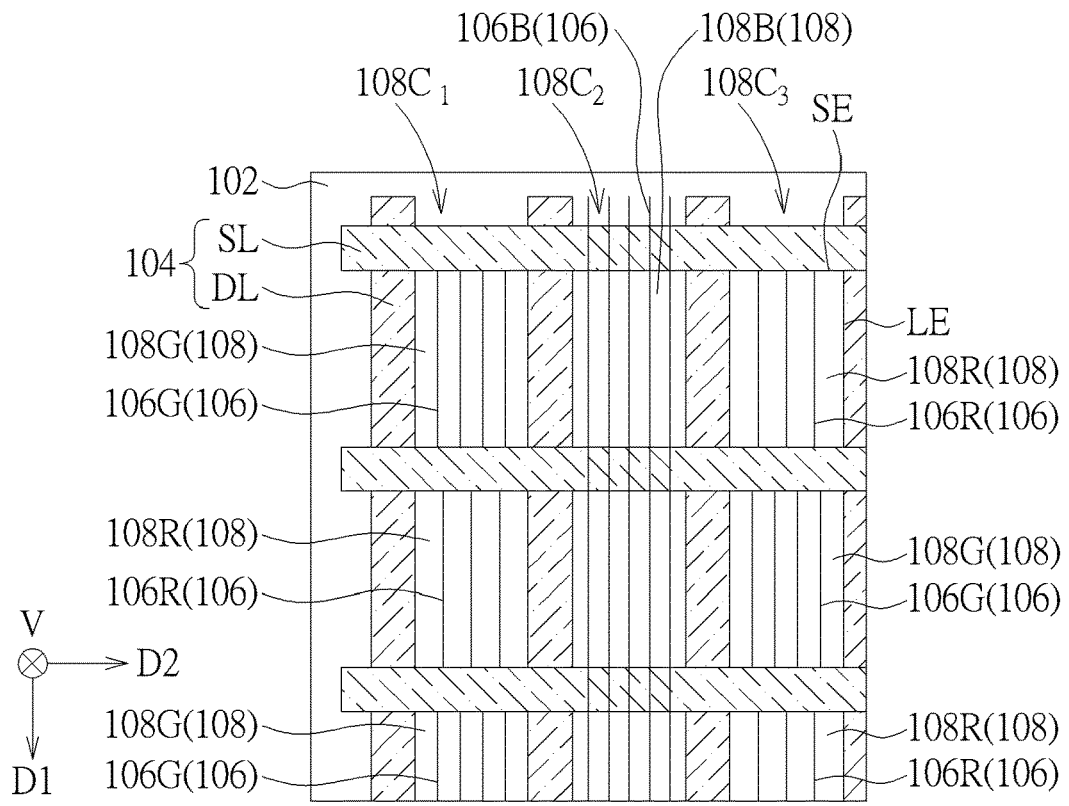
FIG. 7 schematically illustrates a top view of a portion of a substrate of an electronic device according to another embodiment of the present disclosure.

Referring to FIG. 7, FIG. 7 schematically illustrates a top view of a portion of a substrate of an electronic device according to another embodiment of the present disclosure. As shown in FIG. 7, one of the differences between the embodiment (FIG. 1) and the embodiment (FIG. 7) is that the grid structure 104 is defined by the data lines DL and the scan lines SL. The scan lines SL cross the data lines DL to form a plurality of apertures 108. The plurality of apertures are arranged to form a plurality of aperture columns. In the embodiment (FIG. 7), one of the plurality of aperture columns extending along an extending direction of the plurality of polarizing wires 106, and one of the plurality of polarizing wires extends across one of the plurality of apertures. In detail, the aperture column $108C_1$ and the aperture column $108C_3$ include the second apertures 108G and the third apertures 108R disposed alternately along the first direction D1. The order (or the arrangement) of the second apertures 108G and the order (or the arrangement) of the third apertures 108R in the aperture column $108C_1$ is opposite to the order (or the arrangement) of the second apertures 108G and the third apertures 108R in the aperture column $108C_3$. For example, the aperture in the aperture column $108C_1$ may be the second aperture 108G, the aperture in the aperture column $108C_3$ may be the third aperture 108R in the same row. Also, the aperture in the aperture column $108C_1$ may be the third aperture 108R and the aperture in the aperture column $108C_3$ may be the second aperture 108G in the same row.

In this embodiment (FIG. 7), a portion of the polarizing wires 106 extending across the aperture column $108C_1$ and the aperture column $108C_3$ may be discontinuous. For example, the polarizing wire 106 may extend across only one of the apertures 108, but it is not limited thereto. "Discontinuous" means that the polarizing wire is not extending across all of the apertures in the aperture column, or the polarizing wire is not extending across two adjacent ones of the apertures in the aperture column. For example, in the aperture column $108C_1$, the second polarizing wires 106G within one of the second apertures 108G are spaced apart from the third polarizing wires 106R within the adjacent third aperture 108R, the third apertures 108R is located between two second apertures 108G. In the aperture column 108C$_3$, the third polarizing wires 106R within one of the third apertures 108R are spaced apart from the second polarizing wires 106G within the adjacent second apertures 108G, the second apertures 108G is located between two third apertures 108R. In the aperture column 108C$_2$, the first polarizing wires 106B within one of the first apertures 108B are not spaced apart from the second polarizing wires 106B within the adjacent first aperture 108B, the first polarizing wires 106B within one of the first apertures 108B connects to the first polarizing wires 106B within another of the first apertures 108B. In the aperture column 108C$_1$ or the aperture column 108C$_3$, the number of the second polarizing wires 106G corresponding to one of the second aperture 108G is different from the number of the third polarizing wires 106R corresponding to one of the third aperture 108R. The number of the first polarizing wires 106B may be determined by the wavelength of blue light, the number of the second polarizing wires 106G may be determined by the wavelength of green light, and the number of the third polarizing wires 106R may be determined by the wavelength of red light.

In one embodiment (FIG. 7), in the aperture column 108C$_1$ and the aperture column 108C$_3$, the terminals of the second polarizing wires 106G may be aligned to the short edges SE of the corresponding second aperture 108G in the normal direction V of the substrate, and the terminals of the third polarizing wires 106R may be aligned to the short edges SE of the corresponding third apertures 108R in the normal direction V of the substrate. In some embodiments, the second polarizing wires 106G (or the third polarizing wires 106R) may also protrude from the short edges SE of the second apertures 108G (or the third apertures 108R). The arrangement of the first apertures 108B, the second apertures 108G, and the third apertures 108R are not limited to the FIG. 7. In some embodiments, the first polarizing wires 106B extending across the aperture column 108C$_2$ may also be discontinuous.

Figure 8:
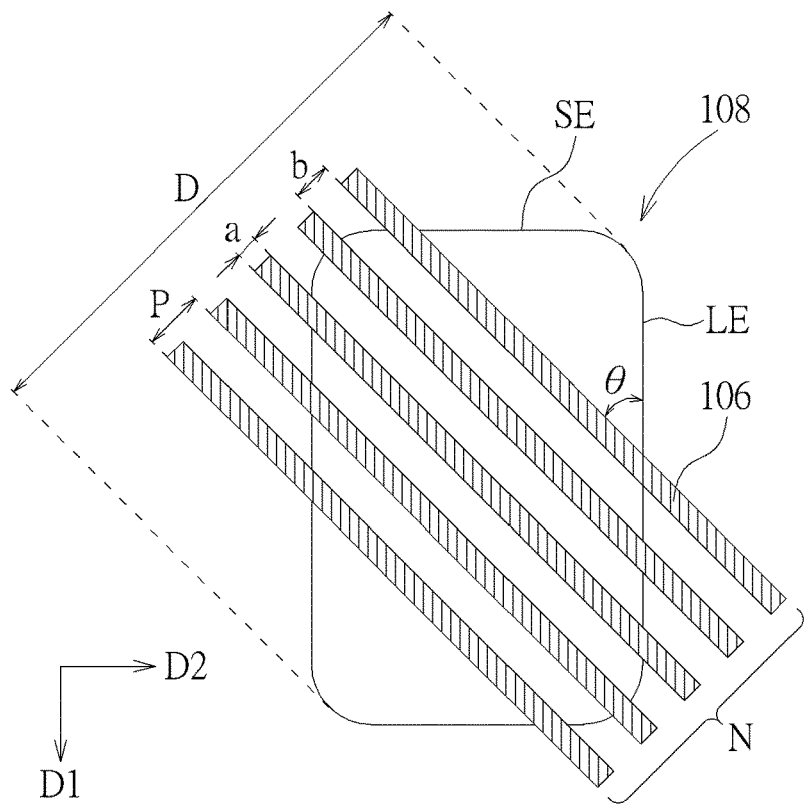
FIG. 8 schematically illustrates a top view of an aperture and a plurality of polarizing wires according to another embodiment of the present disclosure.

Referring to FIG. 8, FIG. 8 schematically illustrates a top view of an aperture and a plurality of polarizing wires according to another embodiment of the present disclosure. As shown in FIG. 8, the difference between the embodiment (FIG. 2) and this embodiment (FIG. 8) is that the included angle θ between the extending direction of the long edge LE of the apertures 108 and the extending direction of the polarizing wires 106 within the aperture 108 is in a range from 30 degrees to 60 degrees. In this embodiment, the included angle θ can be in a range from 40 degrees to 50 degrees. The length "D" in the formula N=D/(1+c)*0.25w may be the length of the diagonal of the corresponding aperture 108, the length "D" is the longest width of the corresponding aperture 108 in the direction perpendicular to the extending direction of the polarizing wires 106.

Figure 9A:
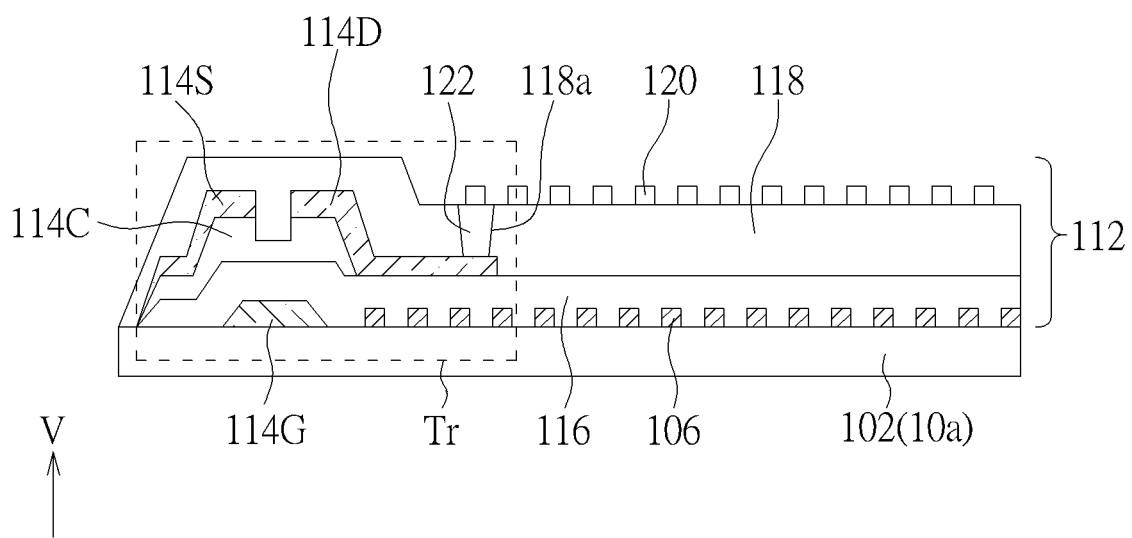
FIG. 9A schematically illustrates a cross-sectional view of an array substrate of an electronic device according to another embodiment of the present disclosure.
Figure 9B:
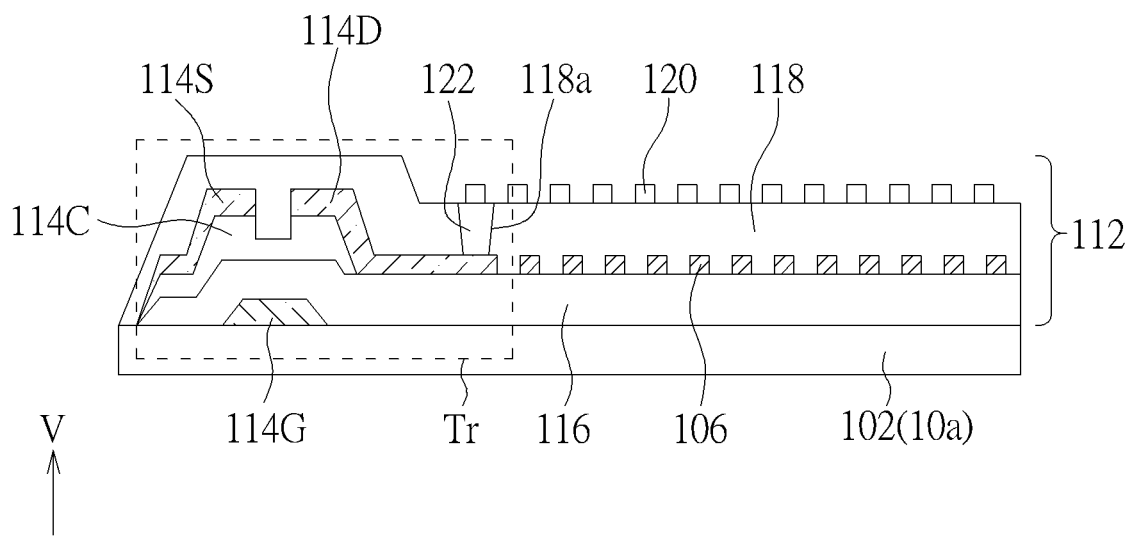
FIG. 9B schematically illustrates a cross-sectional view of an array substrate of the electronic device according to another embodiment of the present disclosure.
Figure 9C:
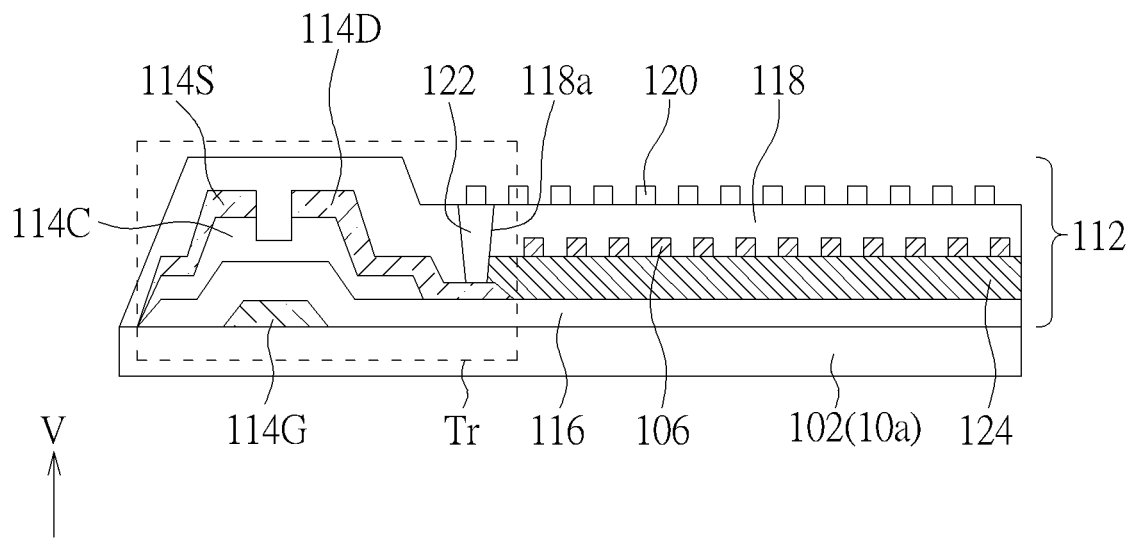
FIG. 9C schematically illustrates a cross-sectional view of an array substrate of an electronic device according to another embodiment of the present disclosure.

Referring to FIG. 9A to FIG. 9C, FIG. 9A to FIG. 9C schematically illustrate three cross-sectional views of an array substrate of the electronic device according to different embodiments of the present disclosure. As shown in FIG. 9A, the polarizing wires 106 may be included in an AM layer 112 disposed on the surface 102a of the substrate 102, the substrate 102 may be an array substrate. Therefore, the scan lines SL, the data lines DL, the transistors Tr, and the polarizing wires 106 may be disposed on the surface 102a of the substrate 102. The transistors Tr includes a gate electrode 114G, a source electrode 114S (e.g. a second metal layer), a drain electrode 114D (e.g. a second metal layer), and a semiconductor layer 114C. The gate electrode 114G is electrically connected to the scan lines SL. The gate electrode 114G, the scan lines SL, and the polarizing wires 106 may be formed of the same conductive layer (e.g. a first metal layer). It is noteworthy that an extending direction of the polarizing wires 106 is parallel to the extending direction of the scan lines SL. In this embodiment, the semiconductor layer 114C comprise the semiconductor material is disposed on the first metal layer. The source electrode 114S, the drain electrode 114D, and the data lines DL are formed of another conductive layer (e.g. a second metal layer) disposed on the semiconductor layer 114C. The source electrode 114S is electrically connected to the data lines DL. A passivation layer 118 is disposed on the second metal layer. At least one pixel electrode 120 (includes transparent conductive material) is disposed on the passivation layer 118, the polarizing wires 106 are disposed between the pixel electrodes 120 and the substrate 102. In this embodiment, the passivation layer 118 may have at least one through hole 118a, and the through hole 118a is disposed with a conductive material 122, so as to electrically connect the pixel electrode 120 and the drain electrode 114D of the transistor Tr. In some embodiments, the drain electrode 114D and source electrode 114S can be exchanged, but it is not limited thereto.

As shown in FIG. 9B, the difference between the embodiment (FIG. 9A) and this embodiment (FIG. 9B) is that the polarizing wires 106 and the data lines DL of this embodiment are formed of the same conducive layer (e.g. the second metal layer), an extending direction of the polarizing wires 106 may be parallel to the data lines DL. As shown in FIG. 9C, the difference between the embodiment (FIG. 9B) and this embodiment (FIG. 9C) is that a light converting layer 124 may be disposed between the polarizing wires 106 (the second metal layer) and the gate insulating layer 116.

Figure 10A:
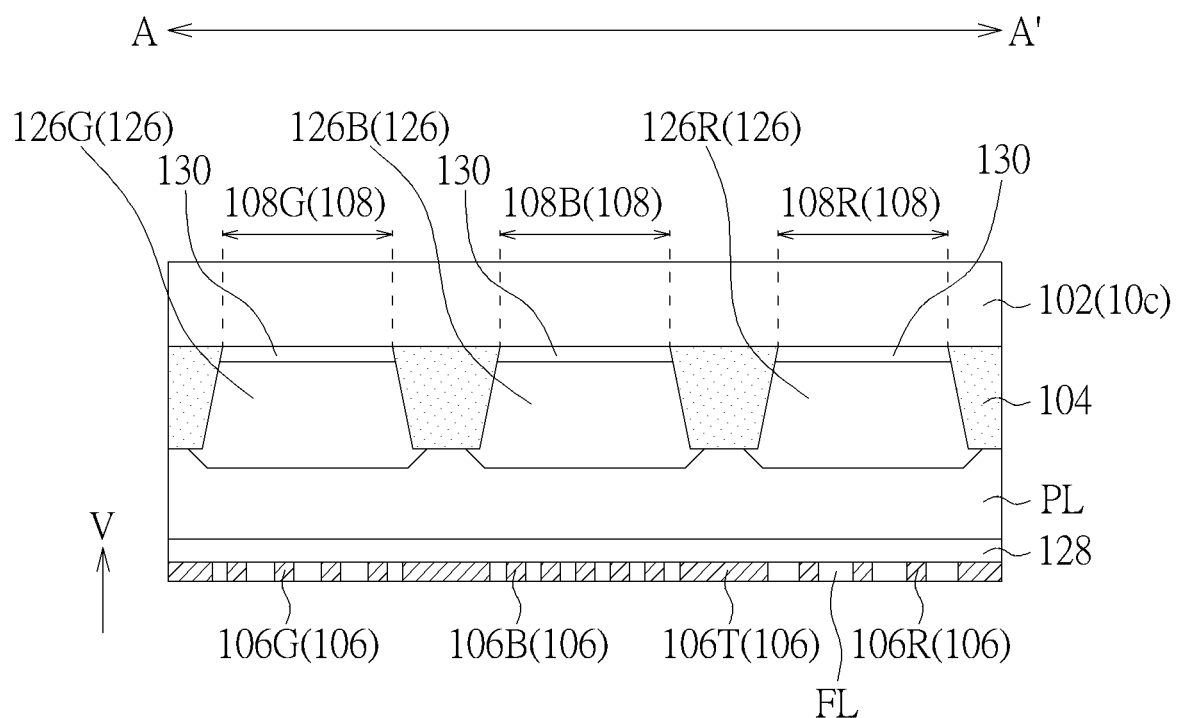
FIG. 10A schematically illustrates a cross-sectional view taken along a line A-A' shown in FIG. 1.
Figure 10B:
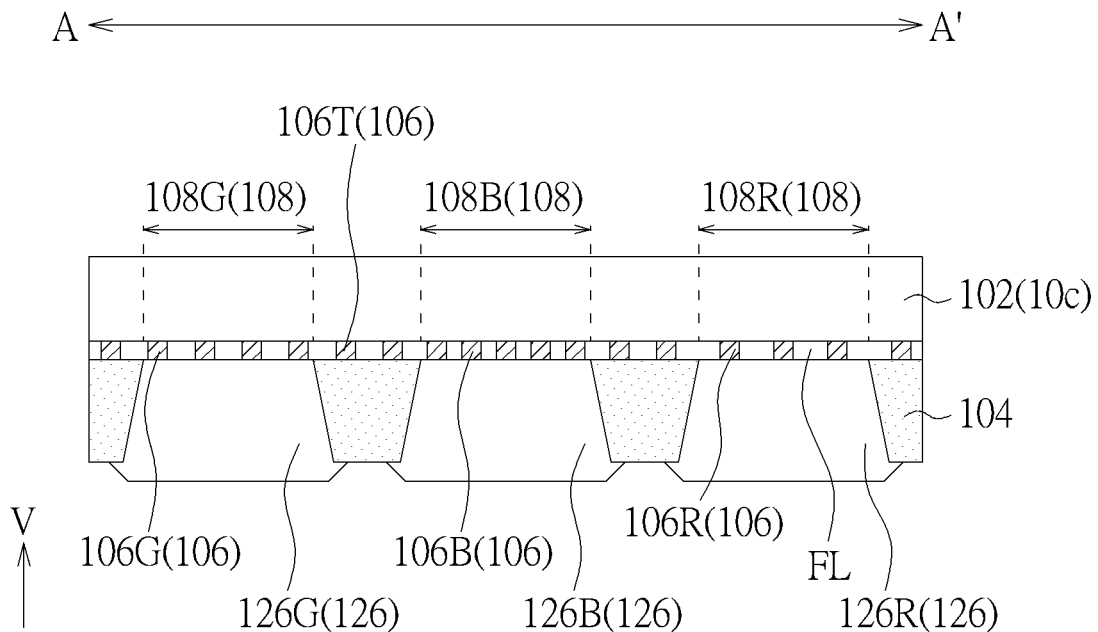
FIG. 10B schematically illustrates another cross-sectional view taken along a line A-A' shown in FIG. 1.
Figure 10C:
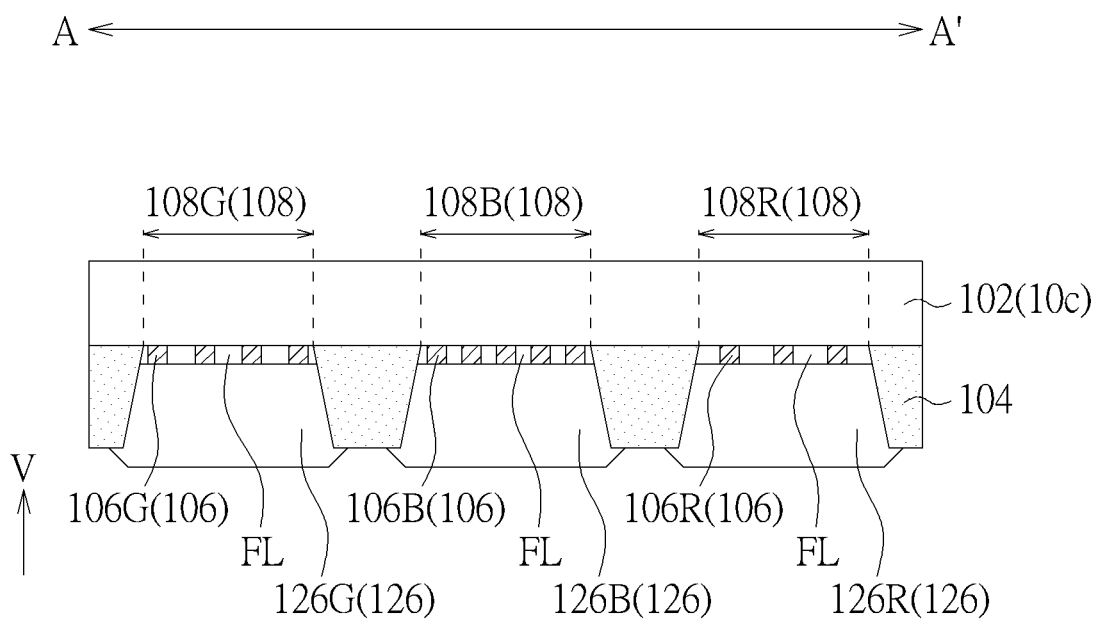
FIG. 10C schematically illustrates another cross-sectional view taken along a line A-A' shown in FIG. 1.

Referring to FIG. 10A to FIG. 10C, FIG. 10A to FIG. 10C schematically illustrate three cross-sectional views taken along a line A-A' shown in FIG. 1. As shown in FIG. 10A, the substrate 102 may be corresponding to the array substrate (such as color filter substrate), the grid structure 104 may be defined by a black matrix layer, the grid structure 104 may be disposed between the polarizing wires 106 and the substrate 102. In this embodiment, the electronic device further includes a plurality of fourth polarizing wires 106T, the fourth polarizing wires 106T does not include slits and thus has a greater width comparing to other polarizing wires (such as the third polarizing wires 106R, the second polarizing wires 106G, and the first polarizing wires 106B). In some embodiments, the fourth polarizing wires 106T can also have slits. A filling layer FL may be alternately disposed with the polarizing wires 106. In some embodiments, the filling layer FL can cover the polarizing wires 106, or the filling layer FL can protect the polarizing wires 106. The filling layer FL may be a single layer or a multilayer that includes a silicon nitride layer or a silicon oxide layer for example, but the disclosure is not limited. In some embodiments, a planarization layer PL may be disposed between the polarizing wires 106 and the grid structure 104. Since the planarization layer PL provides a flat surface facing the polarizing wires 106, the polarizing wires 106 can be disposed on the flat surface. Thus, the polarization of the polarizing wires 106 will reduce the possibility of uneven polarizing wires.

In some embodiments, when the backlight module 214 is white light, a plurality of light converting portions 126 may be disposed on the substrate 102 and in the apertures 108, a first light converting portion 126B including a blue color filter is disposed in the first aperture 108B, a second light converting portion 126G including a green color filter is disposed in the second aperture 108G, a third light converting portion 126R including a red color filter is disposed in the third aperture 108R. In some embodiments, when the backlight module 214 is blue light (or the display layer 206 emits blue light), the first light converting portions 126B may be transparent medium layers, the first light converting portions 126B may not be disposed in the first apertures 108B, and the second light converting portions 126G (includes green QDs or other suitable light conversion material) may be disposed in the second apertures 108G, the third light converting portions 126R (includes red QDs or other suitable light conversion material) may be disposed in the third apertures 108R. In some embodiments, a Bragg layer 128 may be disposed between the polarizing wires 106 and the planarization layer PL. In some embodiments, a plurality of Bragg layers 130 may be disposed between the substrate 102 and the light converting portions 126 (such as 126G, 126B or 126R). The Bragg layer is a kind of transflective layer with half transparent ability and half reflective ability. In some embodiments, the Bragg layers may not be included in the electronic device.

As shown in FIG. 10B, the difference between the structures of FIG. 10A and FIG. 10B is that the filling layer FL and the polarizing wires 106 may be disposed between the grid structure 104 and the substrate 102. Additionally, the fourth polarizing wires 106T have short widths, the fourth polarizing wires 106T may be spaced apart from each other. The planarization layer or the Bragg layers may not be included in the electronic device. As shown in FIG. 10C, the filling layer FL and the polarizing wires 106 are not disposed between the grid structure 104 and the substrate 102. In this embodiment (FIG. 10C), the polarizing wires 106 may be disposed within the corresponding apertures 108, and the polarizing wires 106 may be disposed between the substrate 102 and the corresponding light converting portions 126. For example, the third polarizing wires 106R and the filling layer FL may be disposed in the corresponding third aperture 108R, the third polarizing wires 106R may be disposed between the substrate 102 and the third light converting portion 126R. Therefore, the fourth polarizing wires in FIG. 10B may not be included in the electronic device (FIG. 10C).

Figure 11:
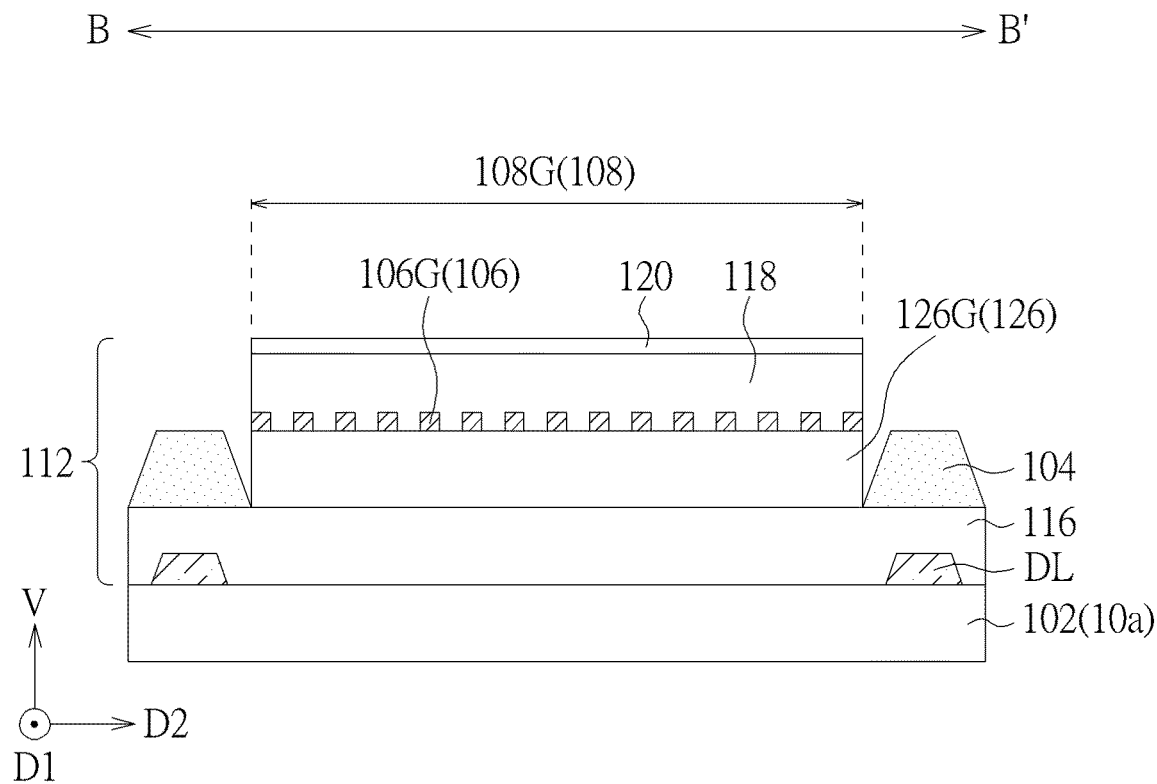
FIG. 11 schematically illustrates a cross-sectional view taken along a line B-B' shown in FIG. 1.

Referring to FIG. 11, FIG. 11 schematically illustrates a cross-sectional view taken along a line B-B' shown in FIG. 1. As shown in FIG. 11, the substrate 102 of this embodiment may be the array substrate, and the polarizing wires 106 and the grid structure 104 (such as black matrix layer) are disposed on the substrate 102. For example, in one of the second apertures 108G, the grid structure 104, the second light converting portion 126G may be disposed on the gate insulating layer 116, the grid structure 104 overlaps the data lines DL (and scan line SL) in the normal direction V of the substrate. The second polarizing wires 106G within the second aperture 108G may be disposed on the second light converting portion 126G. The passivation layer 118 may be disposed between the second polarizing wires 106G and the pixel electrode 120. The second polarizing wires 106G may be disposed between the pixel electrode 120 and the data lines DL. The design described above may also be applied to those structures in the first apertures 108B and the third apertures 108R.

Figure 12:
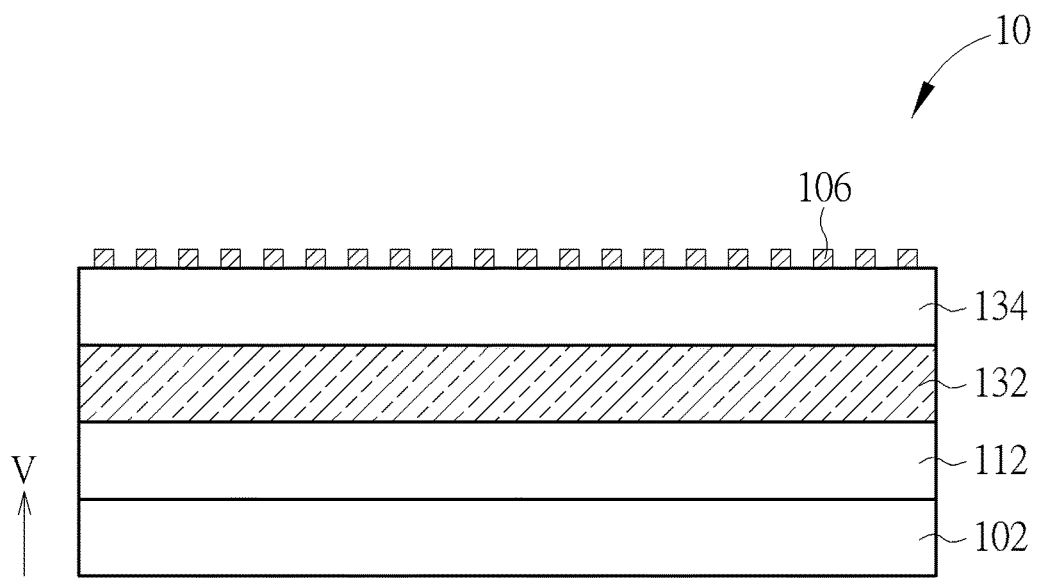
FIG. 12 schematically illustrates a cross-sectional view of an electronic device according to another embodiment of the present disclosure.

FIG. 12 schematically illustrates a cross-sectional view of an electronic device according to another embodiment of the present disclosure. As shown in FIG. 12, the difference between embodiments in FIG. 5 and FIG. 12 is that the electronic device 10 may be an OLED device. In this embodiment, the polarizing wires 106 disposed on the light emitting side of the electronic device 10. In this embodiment, the display layer 132 (such OLED) may be disposed between the AM layer 112 and a capping layer 134, and the polarizing wires 106 are disposed on the capping layer 134. The grid structure of this embodiment may be a pixel define layer (PDL). The number of the polarizing wires 106 within the corresponding aperture is in a range from 50 to 15000. The capping layer 134 may include the insulating material that can protect the display layer 132 below, and the capping layer 134 may provide a flat surface for disposing the polarizing wires 106.

Figure 13:
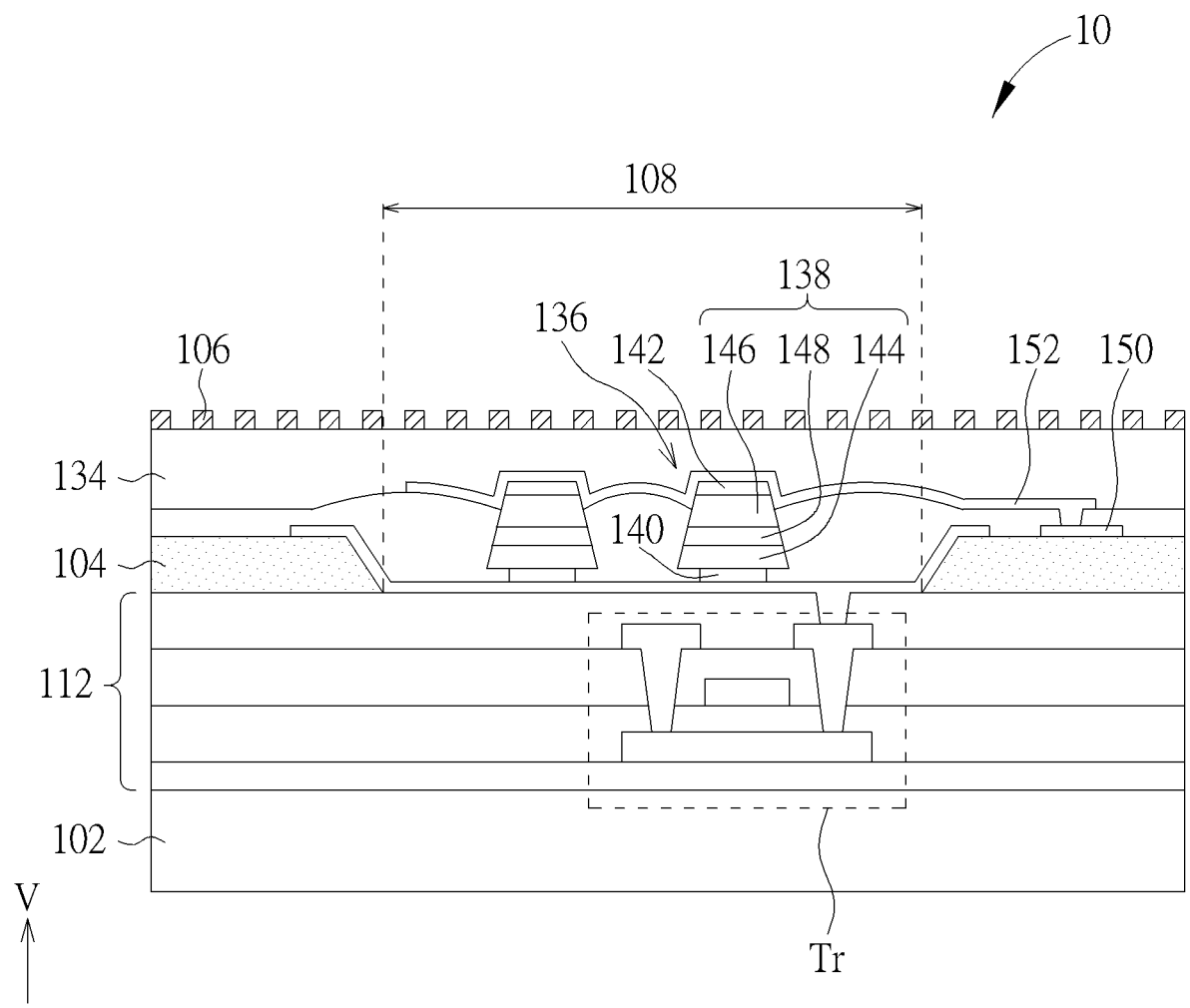
FIG. 13 schematically illustrates a cross-sectional view of an electronic device according to another embodiment of the present disclosure.

FIG. 13 schematically illustrates a cross-sectional view of an electronic device according to another embodiment of the present disclosure. As shown in FIG. 13, the difference between the embodiments in FIG. 5 and FIG. 13 is that the electronic device 10 is a micro-LED (or mini-LED) electronic device. In this embodiment, the polarizing wires 106 are disposed on the light emitting side of the micro-LED (or mini-LED) electronic device. In this embodiment, a plurality of micro-LEDs 136 are disposed between the AM layer 112 and the capping layer 134, the polarizing wires 106 are disposed on the capping layer 134. At least one micro-LED 136 is disposed in one sub-pixel, each of the micro-LEDs 136 may be electrically connected to at least one transistor Tr in the AM layer 112. The micro-LEDs 136 can include a p-n diode 138, a first contact electrode 140 located at one side of the p-n diode 138, a second contact electrode 142 located at another side of the p-n diode 138. The p-n diode 138 can include a first semiconductor layer 144, a second semiconductor layer 146, and multi quantum well (MQW) structure 148 disposed between the first semiconductor layer 144 and the second semiconductor layer 146. The first semiconductor layer 144 can be a p-type semiconductor layer and the second semiconductor layer 146 can be an n-type semiconductor layer, and vice versa. The first contact electrode 140 includes metal may be electrically connected to the transistor Tr, and the second contact electrode 142 includes the transparent conductive material, the second contact electrode 142 may be electrically connected to a signal line 150 through a transparent conductive layer 152. Additionally, the electronic units may respectively include one or more micro-LEDs 136 (which emitting the some color of light). The grid structure 104 of this embodiment may be a spacing structure disposed around the electronic units (include micro-LEDs 136), the micro-LEDs 136 are disposed in the apertures 108 of the grid structure 104. The material of the spacing structure includes dielectric material, reflective material or other suitable material, but the present disclosure is not limited to. The capping layer 134 may include the insulating material that can protect the micro-LEDs 136, and the capping layer 134 may provide a flat surface for disposing the polarizing wires 106.

To summarize the above descriptions, the polarizing wires can be the WGP, the number of the polarizing wires within a corresponding aperture is in the range from 50 to 15000. The number of the polarizing wires within the corresponding aperture can be different according to the wavelengths of different colors of lights emitted through the corresponding aperture or the corresponding electronic unit to enhance the polarizing effect. The number of the polarizing wires within the corresponding aperture is greater when the light penetrating the polarizing wires has the shorter wavelength, and the number of the polarizing wires within the corresponding aperture is less when the light penetrating the polarizing wires has the longer wavelength. In addition, the ratio of a line width of one of the polarizing wires to a gap between two adjacent ones of the polarizing wires is in the range from 0.3 to 3. In the LCD device, the polarizing wires can be disposed on the color filter substrate, the array substrate or both of the color filter substrate and array substrate. The polarizing wires can be disposed on the light emitting side of the OLED electronic device or the micro-LED (or mini-LED) electronic device.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
a substrate;
a grid structure disposed on the substrate and comprising a plurality of scan lines and a plurality of data lines, wherein a plurality of apertures of the grid structure are defined by the plurality of scan lines and the plurality of data lines; and
a plurality of polarizing wires disposed on the substrate and extending across or extending aligned to at least one of the plurality of apertures;
wherein a first number of a portion of the plurality of polarizing wires within a first aperture of the plurality of apertures is in a range from 50 to 15000.

2. The electronic device of claim 1, wherein the first number of the portion of the plurality of polarizing wires within the first aperture is different from a second number of another portion of the plurality of polarizing wires within a second aperture.

3. The electronic device of claim 2, wherein the first number is greater than the second number.

4. The electronic device of claim 3, wherein a first electronic unit corresponding to the first aperture emits a first light with a first wavelength, a second electronic unit corresponding to the second aperture emits a second light with a second wavelength, and the first wavelength is less than the second wavelength.

5. The electronic device of claim 3, wherein the first aperture corresponds to a blue electronic unit and the second aperture corresponds to a green electronic unit.

6. The electronic device of claim 3, wherein two adjacent ones of the plurality of polarizing wires within the first aperture have a first gap, two adjacent ones of the plurality of polarizing wires within the second aperture have a second gap, and the first gap is less than the second gap.

7. The electronic device of claim 3, wherein a first ratio of a line width of one of the plurality of polarizing wires to a gap between two adjacent ones of the plurality of polarizing wires within the first aperture is greater than a second ratio of a line width of one of the plurality of polarizing wires to a gap between two adjacent ones of the plurality of polarizing wires within the second aperture.

8. The electronic device of claim 1, wherein within the first aperture, a ratio of a line width of one of the plurality of polarizing wires to a gap between two adjacent ones of the plurality of polarizing wires is in a range from 0.3 to 3.

9. The electronic device of claim 1, wherein the plurality of apertures are arranged to form a plurality of aperture columns parallel to an extending direction of the plurality of polarizing wires, and one of the plurality of polarizing wires extends across at least two of the plurality of apertures in one of the plurality of aperture columns.

10. The electronic device of claim 1, wherein the plurality of apertures are arranged in a plurality of aperture columns parallel to an extending direction of the plurality of polarizing wires, and one of the plurality of polarizing wires extends across only one of the plurality of apertures.

11. The electronic device of claim 1, wherein the plurality of polarizing wires and the plurality of scan lines are formed of a same conducive layer, and an extending direction of one of the plurality of polarizing wires is parallel to an extending direction of the plurality of scan lines.

12. The electronic device of claim 1, wherein the plurality of polarizing wires and the plurality of data lines are formed of a same conducive layer, and an extending direction of the plurality of polarizing wires is parallel to an extending direction of the plurality of data lines.

13. The electronic device of claim 1, wherein the electronic device is a display device.

14. The electronic device of claim 13, further comprising a plurality of pixel electrodes, wherein the plurality of polarizing wires are disposed between the plurality of pixel electrodes and the substrate.

15. The electronic device of claim 1, wherein an included angle between an extending direction of the first aperture and an extending direction of the portion of the plurality of polarizing wires within the first aperture is in a range from 0 degrees to 90 degrees.

16. The electronic device of claim 1, wherein a line width of one of the plurality of polarizing wires is in a range from 50 nanometers to 500 nanometers.

17. The electronic device of claim 1, further comprising a common electrode, wherein the plurality of polarizing wires are electrically connected to the common electrode.

18. The electronic device of claim 1, further comprising a filling layer, wherein the filling layer and the plurality of polarizing wires are disposed between the grid structure and the substrate.

* * * * *